United States Patent
Allan et al.

(10) Patent No.: US 6,538,911 B1
(45) Date of Patent: Mar. 25, 2003

(54) CONTENT ADDRESSABLE MEMORY WITH BLOCK SELECT FOR POWER MANAGEMENT

(75) Inventors: Graham A. Allan, Stittsville (CA); G. F. Randall Gibson, Nepean (CA); Jason Edward Podaima, Kanata (CA)

(73) Assignee: SiberCore Technologies, Inc., Kanata (CA)

( * ) Notice: Subject to any disclaimer, the term of this patent is extended or adjusted under 35 U.S.C. 154(b) by 0 days.

(21) Appl. No.: 09/938,980

(22) Filed: Aug. 24, 2001

(51) Int. Cl.[7] ............................................... G11C 15/00
(52) U.S. Cl. ................. 365/49; 365/230.03; 365/230.05
(58) Field of Search ............................. 365/49, 230.03, 365/230.05, 189.07; 711/108, 5, 167

(56) References Cited

U.S. PATENT DOCUMENTS

| | | | |
|---|---|---|---|
| 5,555,397 A | * | 9/1996 | Sasama et al. ............... 711/108 |
| 6,230,236 B1 | * | 5/2001 | Schultz et al. ............... 711/108 |
| 6,339,539 B1 | * | 1/2002 | Gibson et al. ................. 365/49 |
| 6,392,910 B1 | * | 5/2002 | Podaima et al. .............. 365/49 |

* cited by examiner

*Primary Examiner*—David Nelms
*Assistant Examiner*—Gene N. Auduong
(74) *Attorney, Agent, or Firm*—Martine & Penilla, LLP

(57) ABSTRACT

An invention is disclosed for a content addressable memory (CAM) with a block select for power management. The CAM includes a plurality of memory blocks for storing data addressable within the CAM, and a search port in communication with the plurality of memory blocks. The search port is capable of facilitating search operations using the memory blocks. Also included in the CAM is a block select bus capable of selecting at least one specific memory block from the plurality of memory blocks. By using the block select bus, the search operations are performed using only the selected memory blocks. Similar to search operations, the block select signal or a similar signal can also be used to select specific memory blocks, wherein maintenance operations are performed using only the selected memory blocks.

29 Claims, 8 Drawing Sheets

400

BINARY DECODE

3 → 8

| BS 2 | BS 1 | BS 0 | AS: |
|---|---|---|---|
| 0 | 0 | 0 | 0 |
| 0 | 0 | 1 | 1 |
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

FIG. 4

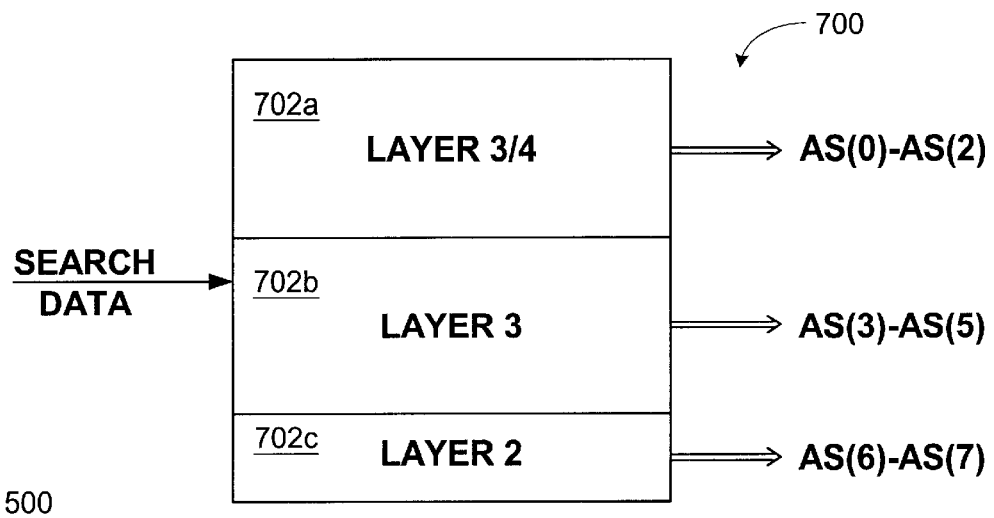
FIG. 7A
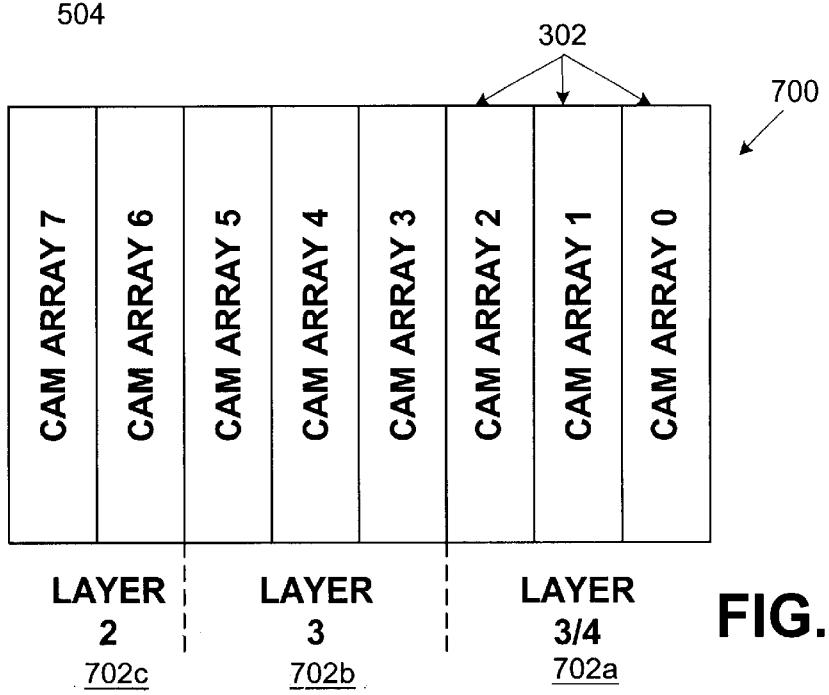
FIG. 7B
FIG. 7C

CONTENT ADDRESSABLE MEMORY WITH BLOCK SELECT FOR POWER MANAGEMENT

CROSS REFERENCE TO RELATED APPLICATIONS

This application is related to U.S. patent application Ser. No. 09/651,426, filed on Aug. 30, 2000, entitled "CONTENT ADDRESSABLE MEMORY HAVING READ/WRITE CAPABILITIES THAT DO NOT INTERRUPT CONTINUOUS SEARCH CYCLES," which is hereby incorporated by reference in its entirety.

BACKGROUND OF THE INVENTION

1. Field of the Invention

This invention relates generally to memory circuits, and more specifically to systems and methods for improved content addressable memory searching using selectable memory blocks.

2. Description of the Related Art

A content addressable memory (CAM) semiconductor device is a device that allows the entire contents of the memory to be searched and matched instead of having to specify one or more particular memory locations in order to retrieve data from the memory. Thus, a CAM may be used to accelerate any application requiring fast searches of a database, list, or pattern, such as in database machines, image or voice recognition, or computer and communication networks.

CAMs provide performance advantages over conventional memory devices having conventional memory search algorithms, such as binary or tree-based searches, by comparing the desired search term, or comparand, against the entire list of entries simultaneously, giving an order-of-magnitude reduction in the search time. For example, a binary search through a non-CAM based database of 1000 entries may take ten separate search operations whereas a CAM device with 1000 entries may be searched in a single operation, resulting in significant time and processing savings. Internet routers often include a CAM for searching the address of specified data, allowing the routers to perform fast address searches to facilitate more efficient communication between computer systems over computer networks.

Conventional CAMs typically include a two-dimensional row and column content addressable memory core array of cells. In such an array, each row typically contains an address, pointer, or bit pattern entry. In this configuration, a CAM may perform "read" and "write" operations at specific addresses as is done in conventional random access memories (RAMs). However, unlike RAMs, data "search" operations that simultaneously compare a bit pattern of data against an entire list (i.e., column) of pre-stored entries (i.e., rows) can be performed.

FIG. 1 shows a simplified block diagram of a conventional CAM 100. The CAM 100 includes a data bus 102 for communicating data, an instruction bus 104 for transmitting instructions associated with an operation to be performed, and an output bus 106 for outputting a result of the operation. For example, in a search operation, the CAM 100 may output a result in the form of an address, pointer, or bit pattern corresponding to an entry that matches the input data.

In operation, the CAM 100 uses search data, or "comparand", supplied using the data bus 102, to perform a parallel compare of the comparand to all of the valid entries stored within the CAM 100. If a match is found, referred to as a "hit", the address of the matching entry is output from the CAM using the output bus 106. In cases where multiple entries match the comparand, such as when a "ternary" CAM is used that allows entries to include bits with a "don't care" state, the CAM 100 may have a priority encoder that resolves the address of the highest priority matching entry.

The CAM often performs look-up functions based on elements of a cell, frame, packet, or datagram header to make intelligent forwarding decisions. The process is similar to a post office reading the address on an envelope to determine the next post office to which the envelope will be delivered. To satisfy the constant need for increasing bandwidth and table size, CAMs have become increasingly fast and dense. Frequently, CAMs are pipelined to increase the look-up rate of the CAM, allowing several look-up functions to be executed in parallel.

While CAMs offer one of the fastest look-up solutions currently available, they have the potential to consume significant power as CAMs scale for increasing density and speed. The parallel search associated with each search operation requires that the comparand be compared to every valid entry in the table. This causes significant consumption of power as many long internal metal tracks transition from one power rail to the other. This type of power is frequently referred to as "$CV^2F$" power since it is derived from the capacitance of the nodes that are transitioning, the square of the voltage difference between the beginning and the end of the transition and the frequency of the transition.

Although most of the CAM memory includes valid entries, often many sections of memory having valid entries do not include actual address data and thus will present a "miss" when the search data is compared to these entries. Since, power consumed in determining an entry does not match the comparand is effectively wasted, searching these entries waste power.

In view of the foregoing, there is a need for low power search methods for use in content addressable memory circuits. The methods should reduce the power required to perform searches in the CAM and preferably not waste power searching entries known to contain non-usable data.

SUMMARY OF THE INVENTION

Broadly speaking, the present invention fills these needs by providing architectures and methods that significantly reduce the power consumption of a CAM by using a block select method applied coincident with search input data. In one embodiment, a CAM is disclosed having a plurality of memory blocks for storing data within the CAM, and a search port in communication with the plurality of memory blocks. The search port is capable of facilitating search operations using the memory blocks. Also included in the CAM is a block select bus capable of selecting at least one specific memory block from the plurality of memory blocks. By using the block select bus, the search operations are performed using only the selected memory blocks. A maintenance port can also be included that is in communication with the plurality of memory blocks. The maintenance port is capable of facilitating maintenance operations using the memory blocks. Similar to search operations, the block select signal or a similar signal is capable of selecting at least one specific memory block from the plurality of memory blocks, wherein the maintenance operations are performed using only the selected memory blocks.

In another embodiment, a system is disclosed for selecting memory blocks within a content addressable memory.

The system includes a block select memory that stores a plurality of memory block selection configurations. Each of the memory block selection configuration determines specific memory blocks of a CAM to enable for a CAM operation. Also included is a binary decode circuit for decoding a binary block select signal. The binary decode circuit selects a particular block selection configuration to utilize for a CAM operation. In one aspect of the present invention, the block select memory includes a block select configuration register having a plurality of bytes, with each byte storing a memory block selection configuration. Each byte comprises a plurality of bits, with each bit in communication with a particular memory block of the CAM. Each bit is then used to enable and disable the particular memory block in communication with the bit. In another aspect, the block select memory includes a plurality of block selection registers, where each block selection register stores a memory block selection configuration. Each block selection register includes a plurality of bits, with each bit in communication with a particular memory block of the CAM and capable of enabling and disabling the particular memory block in communication with the bit.

A system for low power operation of a CAM is disclosed in a further embodiment of the present invention. The system includes a CAM having a plurality of memory blocks, and a block select bus in communication with the CAM, where the block select bus is capable of selecting particular memory blocks from the plurality of memory blocks. The system also includes a first functional circuit capable of outputting a binary block select pattern to the block select bus by applying a first function to received search data. The binary block select pattern determines particular memory blocks to utilize for a search operation. In addition, a second functional circuit capable of outputting a binary block select pattern by applying the same first function to received maintenance data can be included. The binary block select pattern determines particular memory blocks to utilize for a maintenance operation.

In yet a further embodiment, a CAM having multiple tables for data storage is disclosed. The CAM includes a plurality of memory blocks that are partitioned into groups of memory blocks, with each group of memory blocks representing a table. A block select memory is also included that stores a plurality of table selections, wherein each table selection determines a particular group of memory blocks to use in a CAM operation. As above, the block select memory can include a block select configuration register having a plurality of bytes, with each byte storing a table selection. Optionally, the block select memory can include a plurality of block selection registers, with each block selection register storing a table selection.

Advantageously, the embodiments of the present invention reduce power consumption by searching only the CAM arrays capable of providing a chance of a "hit". Moreover, using the block select configuration register of the embodiments of the present invention, increased flexibility is achieved via software programmability. Specifically, the block select configuration register can be programmed online using software since there is no hard binding between a particular block select signal pattern and which particular CAM arrays get selected based on that pattern.

Thus, for example, if only a quarter of a CAM is currently being used, then only that quarter could be searched. However, if two years later the entire CAM is needed, the CAM can be reprogrammed online to search the entire CAM. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which:

FIG. 4 is a table showing an exemplary binary decode mapping, in accordance with an embodiment of the present invention;

FIG. 7A is a block diagram showing a single CAM used for a Layer 2, Layer 3, and Layer 3/4 Networking look-up function, in accordance with an embodiment of the present invention;

FIG. 7B is a diagram showing a block select configuration register configured to select particular Layers, in accordance with an embodiment of the present invention; and FIG. 7C is a block diagram showing a single CAM having CAM arrays partitioned for a Layer 2, Layer 3, and Layer 3/4 Networking look-up function, in accordance with an embodiment of the present invention.

DETAILED DESCRIPTION OF THE PREFERRED EMBODIMENTS

An invention is disclosed for low power search architectures in content addressable memories. To this end, embodiments of the present invention provide architectures and methods that significantly reduce the power consumption of a CAM via a block select method applied coincident with search input data. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
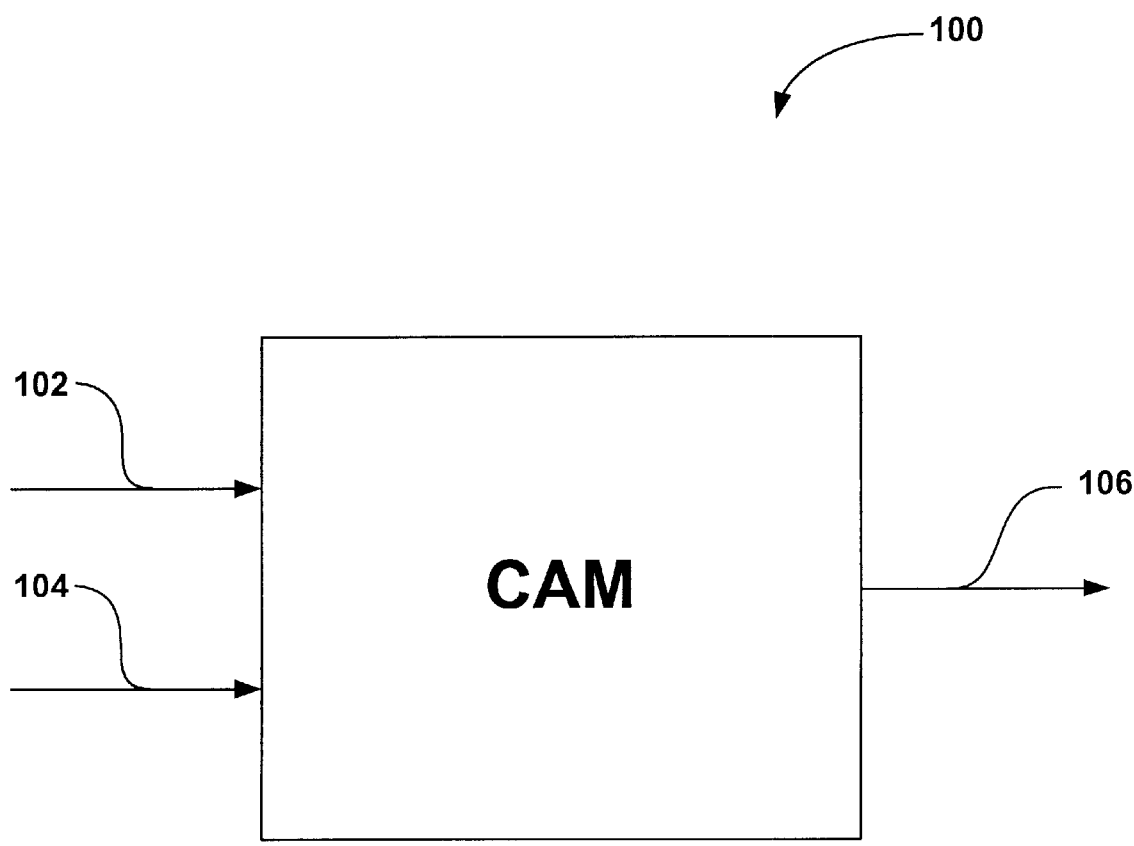
FIG. 1 shows a simplified block diagram of a conventional CAM.
Figure 2:
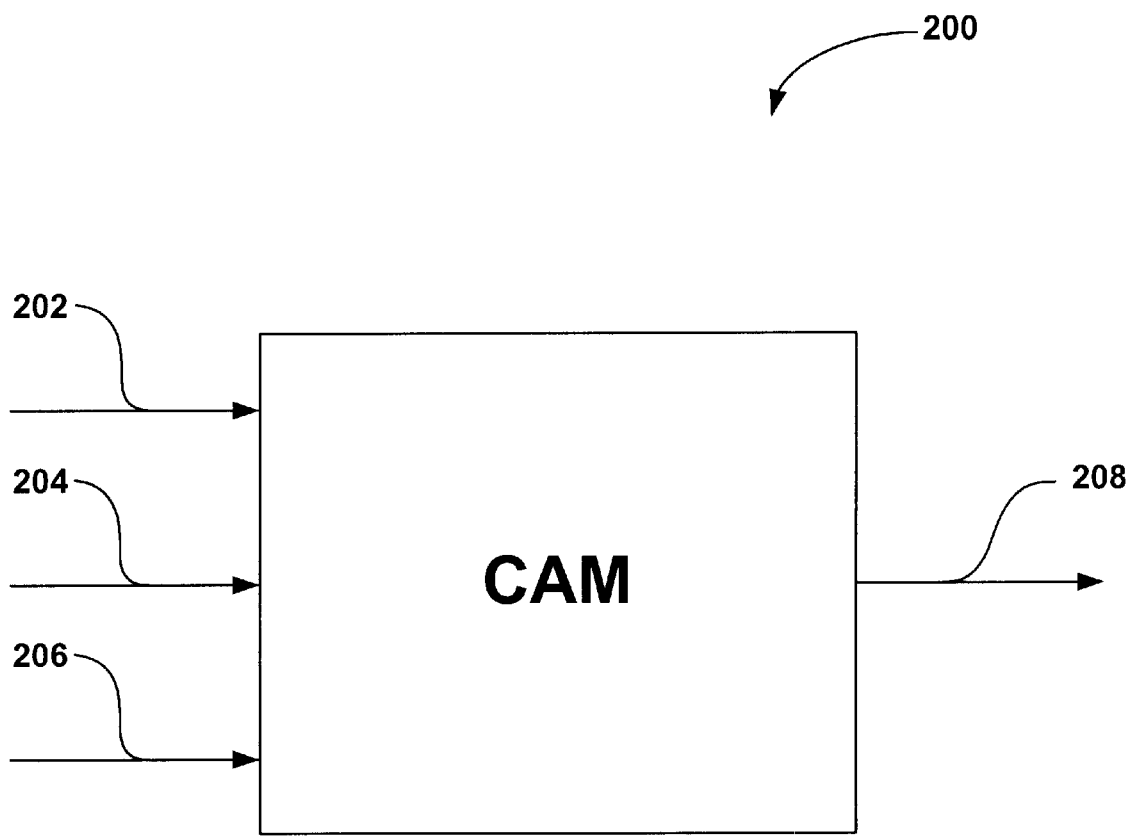
FIG. 2 is a block diagram showing a CAM having a block select for power management, in accordance with an embodiment of the present invention.

FIG. 1 was described in terms of the prior art. FIG. 2 is a block diagram showing a CAM 200 having a block select for power management, in accordance with an embodiment of the present invention. The CAM 200 includes a data bus 202 for communicating data, an instruction bus 204 for transmitting instructions associated with an operation to be performed, an output bus 208 for outputting a result of the operation, and a block select bus 206 for selecting one or more memory blocks to use in the current operation. For example, in a search operation, the CAM 200 may output a result in the form of an address, pointer, or bit pattern corresponding to an entry that matches the input data.

As previously mentioned conventional CAMs perform a compare to every valid entry in the CAM when a search operation is initiated, wasting power whenever a valid entry is searched but known to contain non-matching data, such as when the memory location has not been initialized with data. However, using the block select bus 206 of the embodiments of the present invention power consumption can be reduced. More specifically, the CAM 200 is divided into several memory blocks, each of which can be specifically addressed during read, write, and other operations to the CAM. During a search operation, for example, the search can be limited to a subset of the entire table of the CAM 200 using the block select bus 206, thus reducing the effective power dissipation during search operations.

Figure 3:
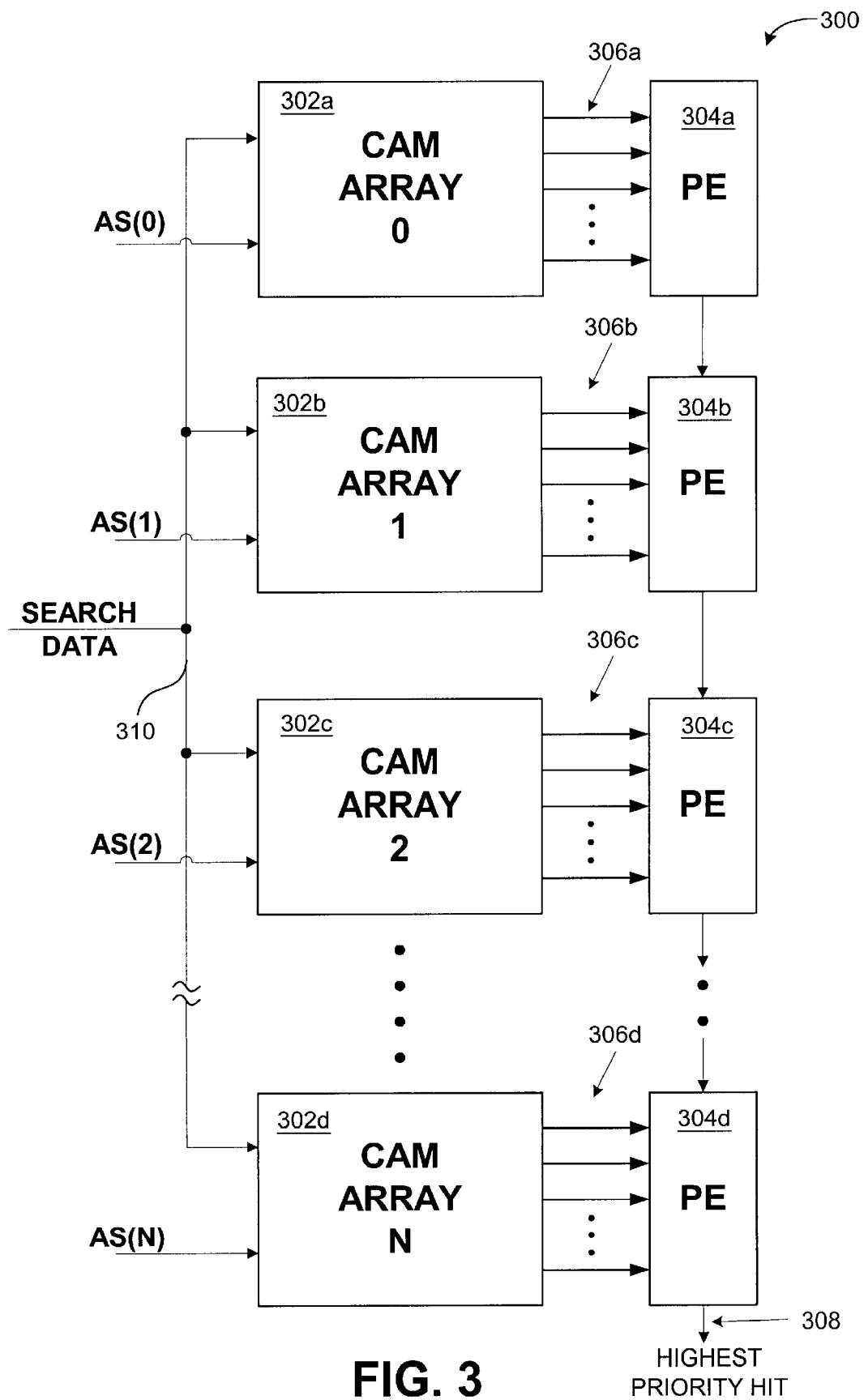
FIG. 3 is an internal block diagram showing a CAM having a block select for power management, in accordance with an embodiment of the present invention.

FIG. 3 is an internal block diagram showing a CAM 300 having a block select for power management, in accordance with an embodiment of the present invention. The CAM 300 includes a plurality of CAM arrays 302a–302d, each coupled to a priority encoder 304a–304d by connections 306a–306d. The priority encoders 304a–304d are further coupled to each other serially to select the highest priority match at the output 308. In addition, an array select signal AS(0)14 AS(N) is provided for each CAM array 302a–302d. During a search operation, search data is provided to each CAM array 302a–302d via the search data bus 310. The results of the search operation from each CAM array 302a–302d are then provided to the priority encoders 304a–304d, which then decode the highest priority "hit" and provide the result at the output 308. Generally, the highest priority "hit" is the match result having an address closest to 0.

As previously mentioned, prior art CAMs search the entire valid contents of the CAM during a search operation, which includes all CAM arrays, regardless of how the CAM memory is divided. The embodiments of the present invention, however, allow selection of particular memory blocks to be searched. Specifically, the embodiments of the present invention allow individual enablement of the CAM arrays 302a–302d using the array select signals AS(0)–AS(N). Using the array select signals AS(0)–AS(N), particular CAM arrays 302a–302d can be searched, while non-selected CAM arrays will not be searched.

More particularly, when a CAM array 302 is enabled using the related array select signal AS, the CAM array will be searched as normal. However, when a CAM array 302 is not enabled using the related array select signal AS, the CAM array will not be searched. Further, the outputs 306 of a non-enabled CAM array 302 are forced to "misses", as when there are no comparand matches within the CAM array 302. Moreover, since all the outputs 306 of a non-enabled CAM array 302 are forced to "misses", the related priority encoder 304 will receive only miss results, and thus function as if the CAM array included no comparand matches. In this manner, the priority encoders 304a–304d are able to function in the same manner, regardless of whether or not the related CAM array is enabled during a search operation. To determine which CAM arrays to enable for a particular search operation, the embodiments of the present invention can use a binary decode procedure.

FIG. 4 is a table showing an exemplary binary decode mapping 400, in accordance with an embodiment of the present invention. In particular, the table of FIG. 4 illustrates a 3 to 8 binary decode mapping 400 using three block select signals BS0, BS1, and BS2, and a resulting array select result AS. The block signals BS0, BS1, and BS2 are provided externally using the block select bus 206, shown in FIG. 2. Depending upon the particular block select signal pattern BS0, BS1, and BS2, a particular array select signal AS will be enabled. For example, when BS0, BS1, and BS2 are set to 0,1,0, respectively, array select signal AS(2) is enabled, and correspondingly, CAM array 2 302c would be searched. Thus, the binary decode mapping 400 allows one CAM array to be active for any particular search. To select multiple CAM arrays for a particular search, a block select configuration register can be used to map the block select signal patterns to the array select signals.

Figure 5A:
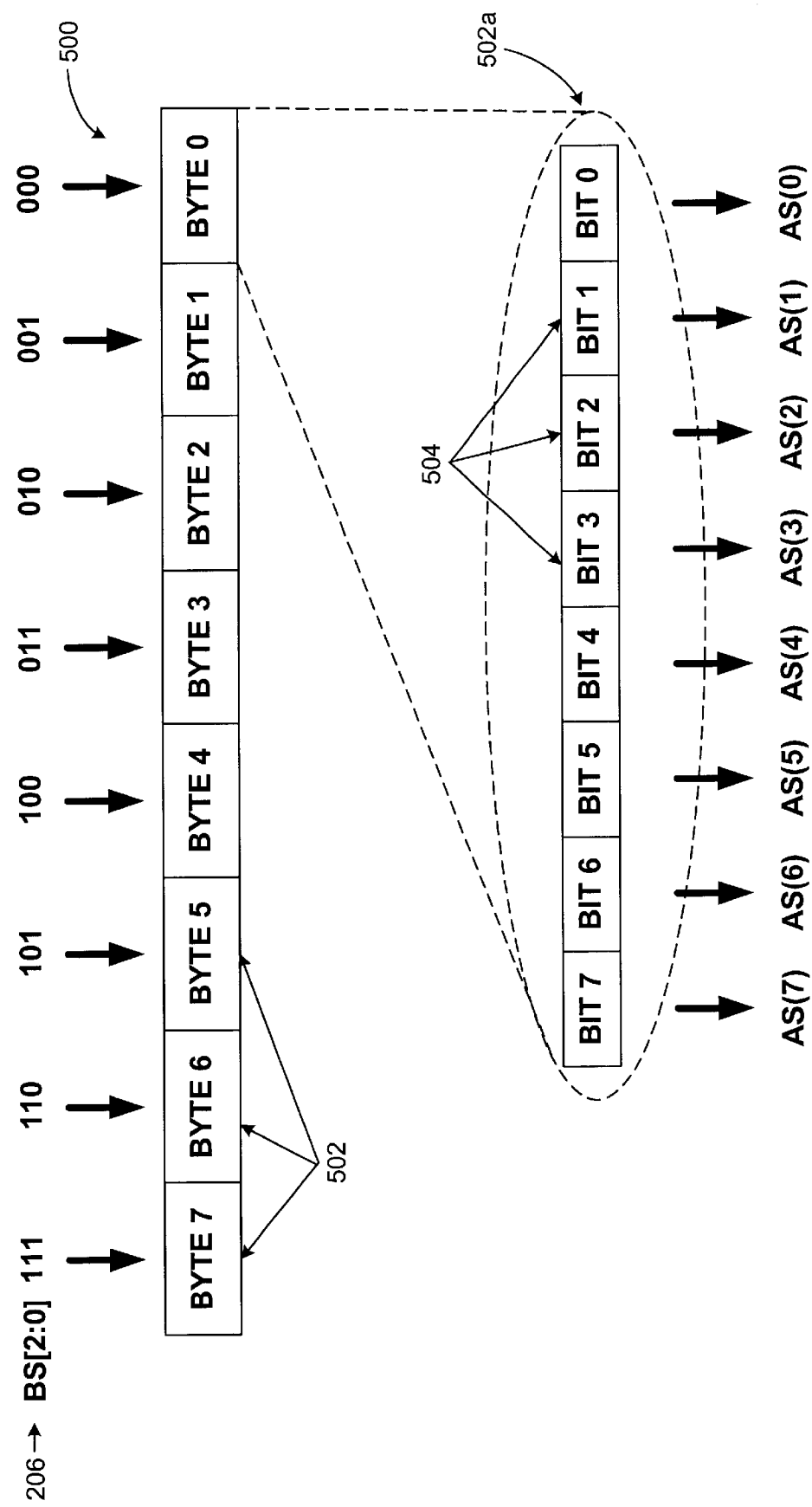
FIG. 5A is a block diagram showing a block select configuration register, in accordance with an embodiment of the present invention.

FIG. 5A is a block diagram showing a block select configuration register 500, in accordance with an embodiment of the present invention. The block select configuration register 500 includes a plurality of bytes 502, each having a plurality of bits 504. For example, FIG. 5A shows a detailed view of BYTE 0 502a of the block select configuration register 500. As shown in FIG. 5A, BYTE 0 502a includes a plurality of bits 504 each coupled to an array select signal AS(0)–AS(7). Although the block select configuration register 500 is described in terms of bytes, it should be noted that any size of bit sample can be used, wherein a bit sample is a plurality of bits 504 grouped into a logical unit. Hence, bit samples of ten bits or twelve bits, for example, can be used in place of the bytes 502.

FIG. 5A illustrates how the block select configuration register 500 can be used to decode a block select signal pattern from the external block select bus 206. In the example of FIG. 5A, there are three block select signals 206 that can be arranged in eight binary states. The block select signals 206 are used to address a portion of the block select configuration register 500. For example, in FIG. 5A, if the block select signals 206 are configured as 0,0,0, byte 0 will be addressed. Similarly, if the block select signals 206 are configured as 0,1,1, byte 3 will be addressed.

As previously mentioned, each byte 502 of the block select configuration register 500 includes eight bits 504. Since, each bit 504 is in communication with an array select signal AS(0)–AS(7), each bit 504 is capable of enabling a separate CAM array 302. In this manner, each byte 502 can be programmed separately to determine particular CAM arrays 302 to be searched in a particular search operation. For example, if a "0"=search the associated CAM array, and "1"=do not search the associated CAM array, then the bit pattern 502a of 0,0,0,0,0,0,0,0=search the entire CAM. Similarly, the bit pattern 502a of 0,0,1,1,1,1,1,1=search only CAM array 7 and CAM array 6, and do not search CAM arrays 0–5. Embodiments of the present invention can also be used in systems where a "1"=search the associated CAM array, and a "0"=do not search the associated CAM array.

Advantageously, the embodiments of the present invention reduce power consumption by searching only the CAM arrays capable of providing a chance of a "hit". Moreover, using the block select configuration register 500 of the embodiments of the present invention, increased flexibility is achieved via software programmability. Specifically, the block select configuration register 500 can be programmed online using software since there is no hard binding between a particular block select signal pattern and which particular CAM arrays get selected based on that pattern. Thus, for example, if only a quarter of a CAM is currently being used, then only that quarter could be searched. However, if two years later the entire CAM is needed, the CAM can be reprogrammed online to search the entire CAM.

In further embodiments, each block select signal pattern can be used to reference a particular block select register from a plurality of block select registers, wherein each bit of a block select register is in communication with an array select signal. Thus, in these embodiments, the block select signal pattern determines which block select register, rather than which byte of a single block select configuration register, to use for a particular CAM operation. In this manner, CAMs having more than eight CAM arrays can have the individual CAM arrays enabled.

Figure 5B:
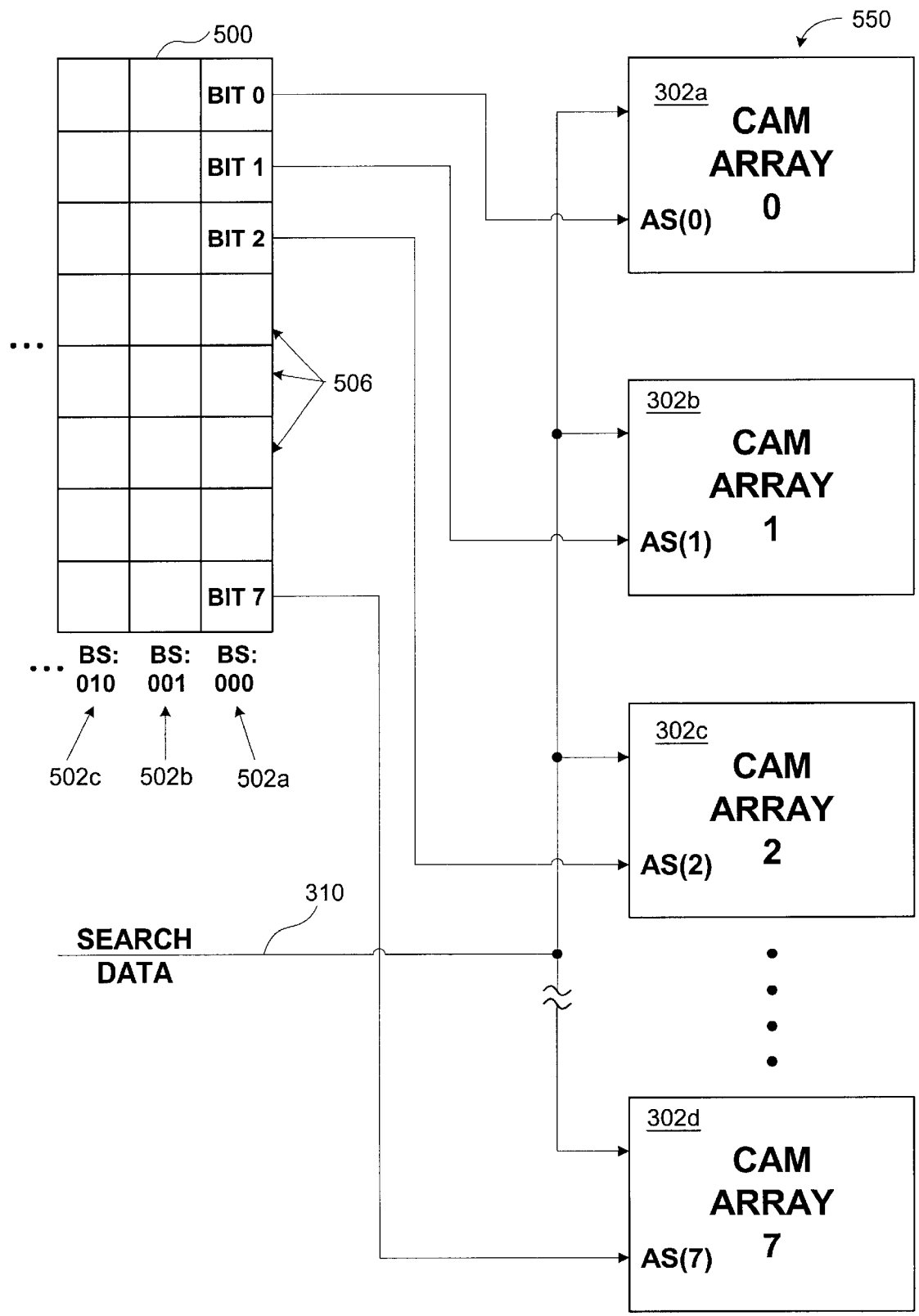
FIG. 5B is an internal block diagram showing a CAM having a block select configuration register for power management, in accordance with an embodiment of the present invention.

FIG. 5B is an internal block diagram showing a CAM 550 having a block select configuration register 500 for power management, in accordance with an embodiment of the present invention. The CAM 550 includes a plurality of CAM arrays 302a–302d, each coupled to an array select signal AS(0)–AS(7). The CAM 550 further includes a block select configuration register 500 comprising a plurality of bytes 502a–502c, wherein each byte 502a–502c includes eight bits 506. Each bit 506 is coupled to a corresponding array select signal AS(0)–AS(7).

During a search operation, search data is provided to each CAM array 302a–302d via search data bus 310. As previously mentioned, the embodiments of the present invention allow selection of particular memory blocks to be searched. Specifically, the embodiments of the present invention allow individual enablement of the CAM arrays 302a–302d using the array select signals AS(0)–AS(7). When a CAM array 302 is enabled using the related array select signal AS, the CAM array will be searched as normal. However, when a CAM array 302 is not enabled using the related array select signal AS, the CAM array will not be searched. Further, the outputs 306 of a non-enabled CAM array 302 are forced to "misses", as when there are no comparand matches within the CAM array.

The block select configuration register 500 includes a plurality of bytes 502a–502c, wherein each byte 502a–502c includes a plurality of bits 506, in this case eight bits. As shown in FIG. 5B, each bit 502 is in communication with a corresponding array signal AS(0)–AS(7). For example, each bit 0 of each byte 502a–502c is in communication with array signal AS(0), and each bit 2 of each byte 502a–502c is in communication with array signal AS(2). In this manner, each byte 502a–502c of the block select configuration register 500 can be configured to enable different combinations of the CAM arrays 302a–302d. It should be noted that although only eight CAM arrays, and eight bits are illustrated in the example of FIG. 5B, any number of CAM arrays and bit groupings can be used as needed by particular CAM designs.

Figure 6:
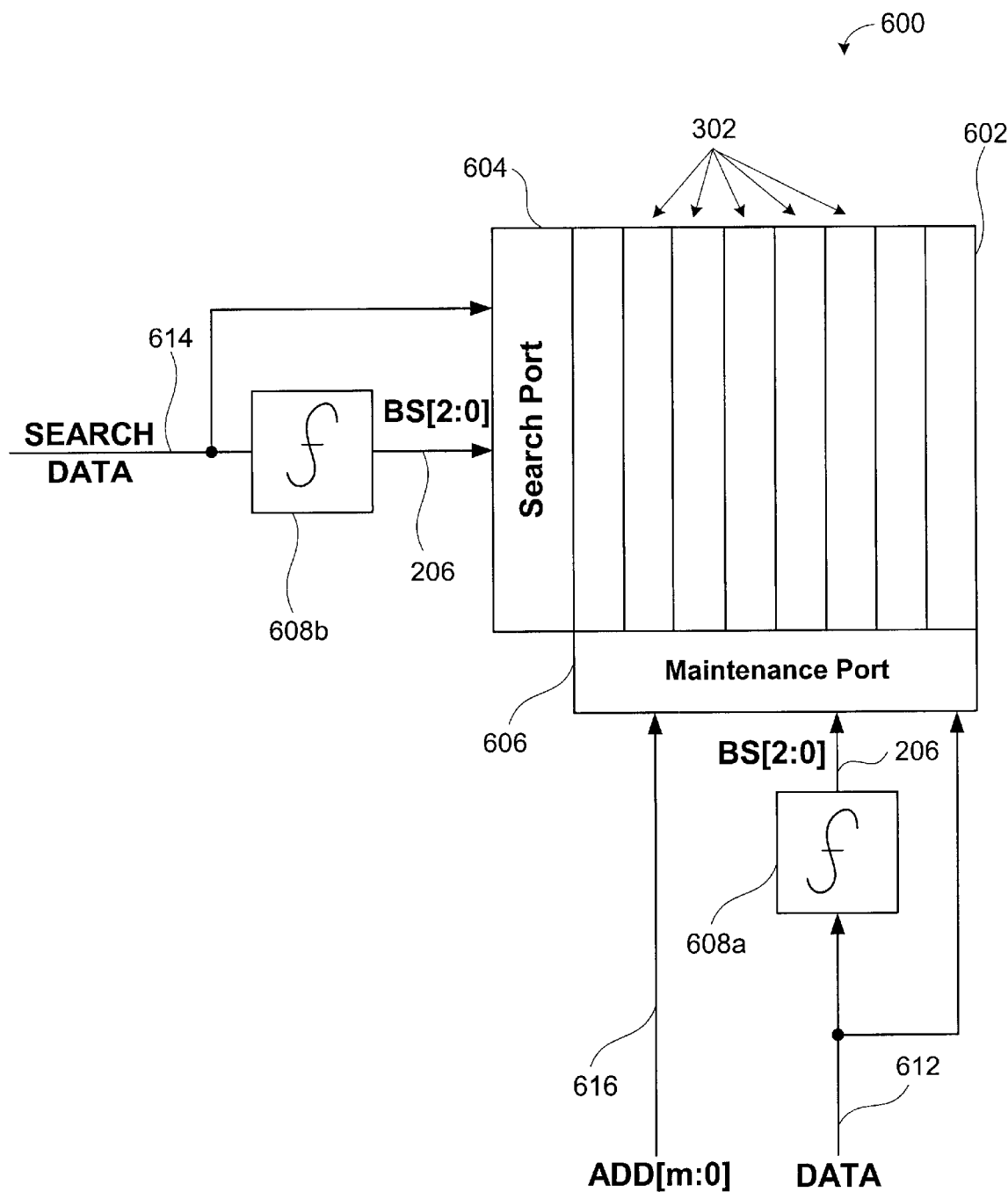
FIG. 6 is schematic diagram showing a system for intelligently placing entries in predictable locations within the CAM, in accordance with an embodiment of the present invention.

In one embodiment, a system is disclosed that intelligently places entries in predictable locations within the CAM. FIG. 6 is schematic diagram showing a system 600 for intelligently placing entries in predictable locations within the CAM, in accordance with an embodiment of the present invention. The system 600 includes a CAM 602 comprising a plurality of CAM arrays 302, a search port 604, and a maintenance port 606. The system also includes a first functional circuitry 608a coupled to the maintenance port 606 and a second functional circuitry 608b coupled to the search port. Both the first and second functional circuitry 608a and 608b perform the same function, and thus, provide the same result for any particular input.

The system 600 allows each search operation to be performed using only one CAM array, thus saving power consumption by searching only one-eighth of the CAM at any particular time. To this end, the system 600 uses functional circuitry 608a and 608b to determine a particular CAM array 302 in which an entry should be stored. To store data in the CAM 602, the data bus 612 and the address bus 616 are used to provide the data to the CAM 602 via the maintenance port 606. The address bus 616 preferably is wide enough to allow full addressing of all the addresses in a single CAM array 302. The data is provided to both the maintenance port 606 and the first functional circuitry 608a. The functional circuitry 608a then applies a function to the data to obtain a 3 bit binary pattern that is provided to the block select bus 206. This 3 bit binary pattern is used to select a particular CAM array 302 in which to store the data. The exact location within the selected CAM array 302 is determined using the address bus 616.

In this manner, the data stored in the CAM can be distributed among the CAM arrays 302. Preferably, the data is sufficiently random so as to allow the CAM arrays 302 to be filled with data at approximately equal rates. In one embodiment, the functional circuitry 608a and 608b applies a hashing function to the data 612 by selecting three bits from the data to serve as the block select signal pattern 206. It should be borne in mind that both the first functional circuitry 608a and the second functional circuitry 608b should yield the same result for any particular input data. It should also be borne in mind that both the first functional circuitry 608a and the second functional circuitry 608b may not be located within the CAM but rather in the device or devices driving the CAM ports 202 and 206.

During search operations, the search data is provided to the search port 604 and the second functional circuitry 608b via the search bus 614. The second functional circuitry 608b then applies an identical function to the search data as the first functional circuitry 608a applies to the maintenance data. The resulting 3 bit pattern is then used as the block select signal pattern 206 for the search operation. Since both the first and second functional circuitry 608a and 608b apply identical functions to all data, the search and maintenance operations will be performed on the same CAM array 302 for any particular set of data. Thus, the search operations will only search the particular CAM array 302 in which the maintenance port 606 would write the same data. As a result, all search operations are performed only on the particular CAM array 302 that can contain a possible match. Although the example shown in FIG. 6 shows a CAM with eight selectable blocks, it should be noted that the first functional circuitry 608a and the second functional circuitry 608b can also be configured to select more than one CAM array when a granularity of less than eight is required. It should be noted that the first functional circuitry 608a and the second functional circuitry 608b can also be configured to use more or less than 3 bits in the block select signal pattern.

Although embodiments of the present invention have thus far been discussed in terms of separate search and maintenance ports, it should be born in mind that embodiments of the present invention can also be used in CAM systems employing other architectures. For example, embodiments of the present invention can be used in CAM systems employing an architecture wherein search comparand data and maintenance operations data are input into the CAM using the same port.

Embodiments of the present invention can also be used in systems storing multiple tables. A system can use one CAM device or CAM subsystem, which is a group of cascaded CAMs that effectively create a denser subsystem that allows more entries than is possible in one device, to store many different tables. The tables can be limited to one or more CAM arrays each, which allows the system to only select the CAM arrays associated with each type of search.

FIG. 7A is a block diagram showing a single CAM 700 used for a Layer 2, Layer 3, and Layer 3/4 Networking look-up function, in accordance with an embodiment of the present invention. The CAM 700 includes a Layer 3/4 partition 702a, a Layer 3 partition 702b, and a Layer 2 partition 702c. Further, each Layer 702a, 702b, and 702c is assigned a particular set of CAM arrays 302. For example, in FIG. 7A the Layer 3/4 partition 702a is assigned to array select signals AS(0)–AS(2), the Layer 3 partition 702b is assigned to array select signals AS(3)–AS(5), and the Layer 2 partition 702c is assigned to array select signals AS(6) –AS(7). It should be noted that there may be overlap between the partitions. For example, the Layer 2 partition 702c could be increased to consume part of the CAM array selected by AS(5) where CAM array 5 is shared between the Layer 2 partition 702c and the Layer 3 partition 702b.

In the CAM 700, when a Layer 2 look-up is requested, it is known in advance that no Layer 3 or Layer 3/4 entries will match the result. Thus, the CAM 700 only enables the CAM array blocks 302 within the CAM 700 that are used to store the Layer 2 entries for that specific search. To this end, the block select configuration register 500 is used.

FIG. 7B is a diagram showing a block select configuration register 500 configured to select particular Layers, in accordance with an embodiment of the present invention. The block select configuration register 500 includes a plurality of bytes 502a–502c. Each of the bytes 502a–502c includes a plurality of bits 504 that are in communication with corresponding array select signals, for example bit 7 is in communication with array select signal AS(7) and bit 1 is in communication with array select signal AS(1).

More specifically, byte 502a is configured to select the Layer 2 partition 702c when the block select signal pattern is 0,0,0. As shown in FIG. 7C, the Layer 2 partition 702c includes CAM array 6 and CAM array 7. Thus, referring back to FIG. 7B, bits 7 and 6 of byte 502a are set to "0" and the remaining bits are set to "1", resulting in CAM arrays 6 and 7 being searched during search operations wherein the block select signal pattern is 0,0,0.

Similarly, byte 502b is configured to select the Layer 3 partition 702b when the block select signal pattern is 0,0,1. As shown in FIG. 7C, the Layer 3 partition 702b comprises CAM array 3, CAM array 4, and CAM array 5. Thus, referring back to FIG. 7B, bits 3, 4, and 5 of byte 502b are set to "0" an d the remaining bits are set to "1", resulting in CAM arrays 3, 4, and 5 being searched during search operations wherein the block select signal pattern is 0,0,1.

Further, byte 502c is configured to select the Layer 3/4 partition 702a when the block select signal pattern is 0,1,0. As shown in FIG. 7C, the Layer 3/4 partition 702a comprises CAM array 0, CAM array 1, and CAM array 2. Thus, referring back to FIG. 7B, bits 0, 1, and 2 of byte 502c are set to "0" and the remaining bits are set to "1", resulting in CAM arrays 0, 1, and 2 being searched during search operations wherein the block select signal pattern is 0,1,0. By not enabling the CAM arrays outside the particular Layer partition needed, the CAM 700 con serves power as well as ensuring there is no danger of incorrectly missing a match in the blocks that were not selected.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. Additionally, the various block diagrams may be embodied in any form which may include, for example, any suitable computer layout, semiconductor substrate, semiconductor chip or chips, printed circuit boards, packaged integrated circuits, or software implementations (and combinations thereof).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A content addressable memory (CAM), comprising:
   a plurality of memory blocks for storing data within the CAM;
   a search port in communication with the plurality of memory blocks, the search port capable of facilitating search operations using the memory blocks; and
   a block select bus capable of selecting at least one specific memory block from the plurality of memory blocks, wherein the search operations are performed using only the selected memory blocks.

2. A CAM as recited in claim 1, further comprising a maintenance port in communication with the plurality of memory blocks, the maintenance port capable of facilitating maintenance operations using the memory blocks.

3. A CAM as recited in claim 2, wherein the block select signal is further capable of selecting at least one specific memory block from the plurality of memory blocks, wherein the maintenance operations are performed using only the selected memory blocks.

4. A CAM as recited in claim 1, wherein the search port is further capable of facilitating maintenance operations using the memory blocks.

5. A CAM as recited in claim 4, wherein the block select signal is further capable of selecting at least one specific memory block from the plurality of memory blocks, wherein the maintenance operations are performed using only the selected memory blocks.

6. A CAM as recited in claim 1, wherein a binary decode is used to decode block select signal patterns from the block select bus to select the at least one specific memory block.

7. A CAM as recited in claim 1, wherein the block select bus is capable of selecting a plurality of specific memory blocks from the plurality of memory blocks.

8. A CAM as recited in claim 7, further comprising a block select configuration register in communication with the block select bus, the block select configuration register capable of selecting the plurality of specific memory blocks.

9. A CAM as recited in claim 8, wherein the block select configuration register includes a plurality of bit samples, each bit sample storing a memory block selection configuration.

10. A CAM as recited in claim 9, wherein each bit sample comprises a plurality of bits, each bit in communication with a particular memory block of the CAM.

11. A CAM as recited in claim 10, wherein each bit is capable of enabling and disabling the particular memory block in communication with the bit.

12. A system for selecting memory blocks within a content addressable memory, comprising:

a block select memory storing a plurality of memory block selection configurations, wherein each memory block selection configuration determines specific memory blocks of a content addressable memory (CAM) to enable for a CAM operation; and a processing circuit that processes a block select signal, wherein the processing circuit selects a particular block selection configuration to utilize for a CAM operation.

13. A system as recited in claim 12, wherein the processing circuit is a binary decode circuit that decodes a binary block select signal using a binary decode technique.

14. A system as recited in claim 12, wherein the block select memory includes a block select configuration register having a plurality of bit samples, each bit sample storing a memory block selection configuration.

15. A system as recited in claim 14, wherein each bit sample comprises a plurality of bits, each bit in communication with a particular memory block of the CAM.

16. A system as recited in claim 15, wherein each bit is capable of enabling and disabling the particular memory block in communication with the bit.

17. A system as recited in claim 12, wherein the block select memory includes a plurality of block selection registers, each block selection register storing a memory block selection configuration.

18. A system as recited in claim 17, wherein each block selection register includes a plurality of bits, each bit in communication with a particular memory block of the CAM.

19. A system as recited in claim 18, wherein each bit is capable of enabling and disabling the particular memory block in communication with the bit.

20. A system for low power operation of a content addressable memory (CAM), comprising:

a CAM having a plurality of memory blocks;

a block select bus in communication with the CAM, the block select bus capable of selecting particular memory blocks from the plurality on memory blocks; and a first functional circuit capable of outputting a binary block select pattern to the block select bus by applying a first function to received search data, wherein the binary block select pattern determines particular memory blocks to utilize for a search operation.

21. A system as recited in claim 20, further comprising a second functional circuit capable of outputting a binary block select pattern by applying the first function to received maintenance data, wherein the binary block select pattern determines particular memory blocks to utilize for a maintenance operation.

22. A system as recited in claim 21, further comprising a block select configuration register in communication with the block select bus, the block select configuration register capable of selecting the plurality of specific memory blocks.

23. A content addressable memory (CAM) having multiple tables for data storage, comprising:

a plurality of memory blocks, the memory blocks being partitioned into groups of memory blocks, each group of memory blocks representing a table; and a block select memory storing a plurality of table selections, wherein each table selection determines a particular group of memory blocks to use in a CAM operation.

24. A CAM as recited in claim 23, wherein the block select memory includes a block select configuration register having a plurality of bit samples, each bit sample storing a table selection.

25. A CAM as recited in claim 24, wherein each bit sample comprises a plurality of bits, each bit in communication with a particular memory block of the CAM.

26. A CAM as recited in claim 25, wherein each bit is capable of enabling and disabling the particular memory block in communication with the bit.

27. A CAM as recited in claim 23, wherein the block select memory includes a plurality of block selection registers, each block selection register storing a table selection.

28. A CAM as recited in claim 27, wherein each block selection register includes a plurality of bits, each bit in communication with a particular memory block of the CAM.

29. A CAM as recited in claim 28, wherein each bit is capable of enabling and disabling the particular memory block in communication with the bit.

* * * * *